United States Patent [19]

Yamazaki

[11] Patent Number: 5,469,381
[45] Date of Patent: Nov. 21, 1995

[54] SEMICONDUCTOR MEMORY HAVING NON-VOLATILE SEMICONDUCTOR MEMORY CELL

[75] Inventor: Hirokazu Yamazaki, Kawasaki, Japan

[73] Assignee: Fujitsu Limited, Kawasaki, Japan

[21] Appl. No.: 949,236

[22] PCT Filed: Mar. 18, 1992

[86] PCT No.: PCT/JP92/00323

§ 371 Date: Nov. 16, 1992

§ 102(e) Date: Nov. 16, 1992

[87] PCT Pub. No.: WO92/16946

PCT Pub. Date: Jan. 10, 1992

[30] Foreign Application Priority Data

Mar. 19, 1991 [JP] Japan ................. 3-055042

[51] Int. Cl.$^6$ ................................. G11C 11/34
[52] U.S. Cl. ................. 365/185.01; 365/189.05
[58] Field of Search ................. 365/185, 189.05; 307/450

[56] References Cited

U.S. PATENT DOCUMENTS

| | | | |
|---|---|---|---|
| 4,829,203 | 5/1989 | Ashmore, Jr. | 307/469 |
| 5,016,217 | 5/1991 | Brahmblatt | 365/185 |
| 5,126,969 | 6/1992 | Kawana | 365/149 |
| 5,311,470 | 5/1994 | Atsumi | 365/189.05 |

FOREIGN PATENT DOCUMENTS

| | | | |
|---|---|---|---|
| 48505 | 5/1985 | Japan | 365/185 |
| 2-3194A | 6/1988 | Japan | 365/185 |
| 2-3194 | 1/1990 | Japan . | |
| 3-123118 | 5/1991 | Japan . | |
| 4-67396 | 3/1992 | Japan . | |
| 2077492 | 6/1980 | United Kingdom . | |

*Primary Examiner*—William L. Sikes
*Assistant Examiner*—Tiep H. Nguyen
*Attorney, Agent, or Firm*—Staas & Halsey

[57] ABSTRACT

A semiconductor memory having a non-volatile semiconductor memory cell, wherein the depletion of electrons from the semiconductor memory cell takes place in conjunction with the depletion of electrons from a load transistor so that a voltage difference between each threshold voltage can be maintained at the same level, and a writing operation is performed in a configuration where the load transistor of the non-volatile semiconductor memory cell is equipped with, like the non-volatile semiconductor memory cell, a floating gate, so that an initially stored memory content of the semiconductor memory cell can be read out.

15 Claims, 4 Drawing Sheets

5,469,381

SEMICONDUCTOR MEMORY HAVING NON-VOLATILE SEMICONDUCTOR MEMORY CELL

FIELD OF THE INVENTION

The present invention pertains to a semiconductor memory, such as an EPROM or an EEPROM, having a non-volatile semiconductor memory cell.

BACKGROUND ART

FIGS. 1A and 1B are circuit diagrams of an example of a conventional non-volatile semiconductor memory, specifically showing a main part of a memory cell portion of an EPROM. Referring to FIG. 1A, 1 represents an EPROM cell constituting a memory cell; 2 a word line; 3 an enhancement nMOS serving as a load transistor; 4 a power line for supplying a power supply voltage Vcc of, for example, +5 [V]; 5 an amplifier; and 6 an output terminal.

FIG. 1B is a circuit diagram showing a configuration of an amplifier 5. The amplifier 5 of FIG. 1B is an inverter constructed by a cascade connection of inverters 51 and 52. There is a feedback from a point midway between the inverters back to a PMOS transistor 53, resulting in a high-speed build-up of the circuit.

In such a memory cell portion, if a power supply voltage Vcc is set for the word line 2 when no electrons are injected into a charge storage gate of the EPROM cell 1, i.e. a so-called floating gate (when nothing is written thereto; in other words when a logic state of the memory is "1"), then the EPROM cell 1 is turned ON and a current flows from the drain to the source of the EPROM cell 1. As a result, the level of voltage of a node 7 drops to 0 [V], which voltage is output to the output terminal 6 via the amplifier 5.

On the other hand, if a power supply voltage Vcc is set for the word line 2 when electrons are injected into the floating gate of the EPROM cell 1 (when something is written thereto; in other words when a logic state of the memory is "0"), the EPROM cell 1 is not turned ON and a current does not flow from the drain to the source of the EPROM cell 1. As a result, the level of voltage of the node 7 rises to the power supply voltage Vcc [V], which voltage is output to the output terminal 6 via the amplifier 5.

In other words, in such a memory cell portion, the nMOS 3 which serves as a load transistor is designed in such a manner that the voltage of the node 7 is 0 [V] when nothing is written in the EPROM cell 1, i.e., when the logic state thereof is "1", and the voltage of the node 7 is Vcc [V] when something is written in the EPROM cell 1, i.e. when the logic state thereof is "0".

However, such an EPROM has a disadvantage in that, despite the writing of the logic "0" into the EPROM cell 1, i.e. despite the injection of electrons into the floating gate of the EPROM cell 1, the electrons in the floating gate of the EPROM cell 1 are depleted by being heated in a subsequent assembly process or an acceleration test.

The effect of such a depletion of electrons increases greatly as the size of the EPROM cell 1 is reduced, presenting a serious problem with regard to the large-capacity memories currently used. It should also be noted that such a depletion of electrons occurs as a result of age deterioration.

The above disadvantage leads to a problem in that, in case a plurality of the semiconductor memories described above are used in a redundancy address memory circuit (see FIG. 6), the function of switching to a redundancy cell, which switching becomes necessary when a defect occurs anywhere in a cell array, can not be fully accomplished because of the depletion of electrons from the floating gate during the above-mentioned assembly process, for example.

DISCLOSURE OF THE INVENTION

In view of the above problem, the object of the present invention is to provide a non-volatile semiconductor memory capable of reading out an initially stored memory content even after a depletion of electrons due either to heating during an assembly process or an acceleration test or to age deterioration, the assembly process or the acceleration test being carried out subsequent to the injection of electrons into the floating gate of non-volatile semiconductor memory cells such as an EPROM cell or an EEPROM cell.

The above object of the present invention is achieved by a semiconductor memory comprising a non-volatile semiconductor memory cell having a charge storage gate, and a write enabled load transistor having, like the above-mentioned semiconductor memory cell, a charge storage gate, the load transistor being provided for reading the content of the above-mentioned semiconductor memory cell.

Such a memory makes it possible to read out an initially stored memory content even after a depletion of electrons due either to heating during an assembly process or an acceleration test or to age deterioration, the assembly process or the acceleration test being carried out subsequent to the injection of electrons into the floating gate of a non-volatile semiconductor memory cell such as an EPROM cell or an EEPROM cell.

BRIEF DESCRIPTIONS OF THE DRAWINGS

BEST MODE OF CARRYING OUT THE INVENTION

Figure 1A:
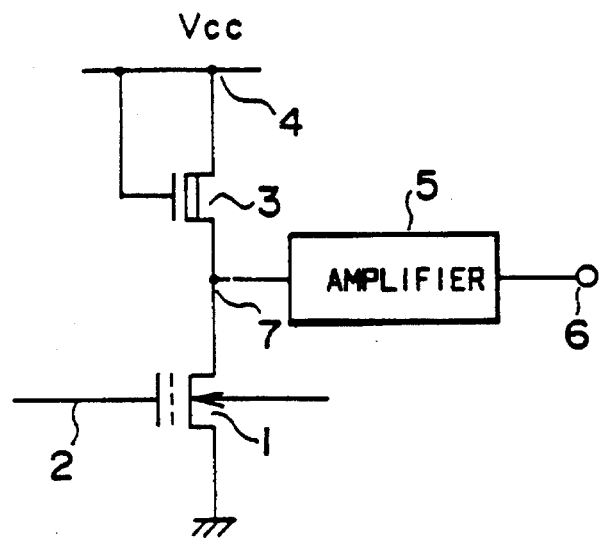
FIG. 1A and FIG. 1B are diagrams depicting a main part of a conventional non-volatile semiconductor memory.
Figure 1B:
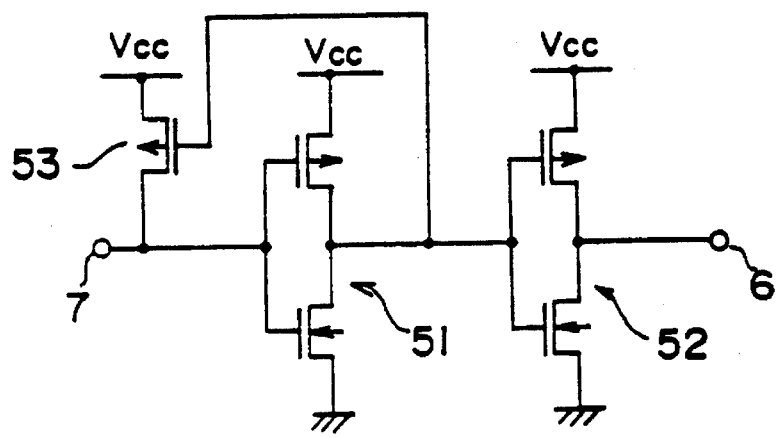
Figure 2:
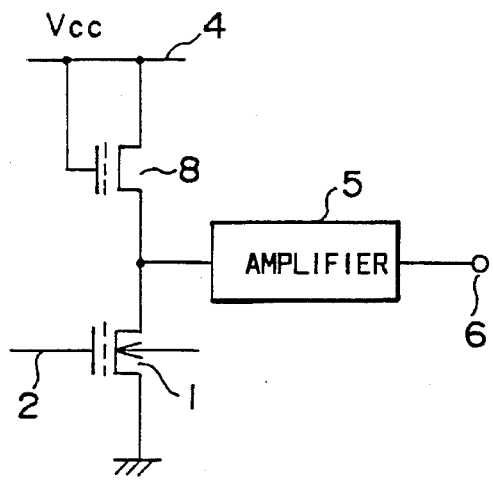
FIG. 2 is a diagram depicting a main part of an embodiment of the present invention.

FIG. 2 is a diagram depicting a main part of an embodiment of the present invention. Parts that are the same as those in FIGS. 1A and 1B are given the same reference numerals.

The non-volatile semiconductor memory of the present invention comprises a non-volatile semiconductor memory cell 1 having a floating gate, and a load transistor 8 provided for reading the contents of the semiconductor memory cell 1. The load transistor 8 is configured to have, like the non-volatile semiconductor memory cell 1, a floating gate, and to be write enabled. 2 represents a word line; 4 a power line for supplying a power supply voltage Vcc; 5 an amplifier; and 6 an output terminal. The amplifier 5 is configured in the same way as shown in FIG. 1B.

The injection of electrons into the floating gate of the load transistor 8 in conjunction with the injection of electrons into the floating gate of the non-volatile semiconductor memory cell 1 ensures that, as electrons are depleted from the floating gate of the semiconductor memory cell 1 due either to heating during a subsequent assembly process or an acceleration test or to age deterioration, electrons in the floating gate of the load transistor 8 are also depleted.

This means that a voltage difference $Vth_8$–$Vth_1$ between a threshold voltage $Vth_8$ of the load transistor 8 and a threshold voltage $Vth_1$ of the semiconductor memory cell 1 is maintained at the same level. Consequently, the depletion of electrons from the floating gate of the semiconductor memory cell 1 does not prevent the reading out of an initially stored memory content.

While FIG. 1A shows an EPROM cell used as a non-volatile memory cell, this is only for the sake of convenience; a non-volatile memory cell can also be an EEPROM.

Figure 3:
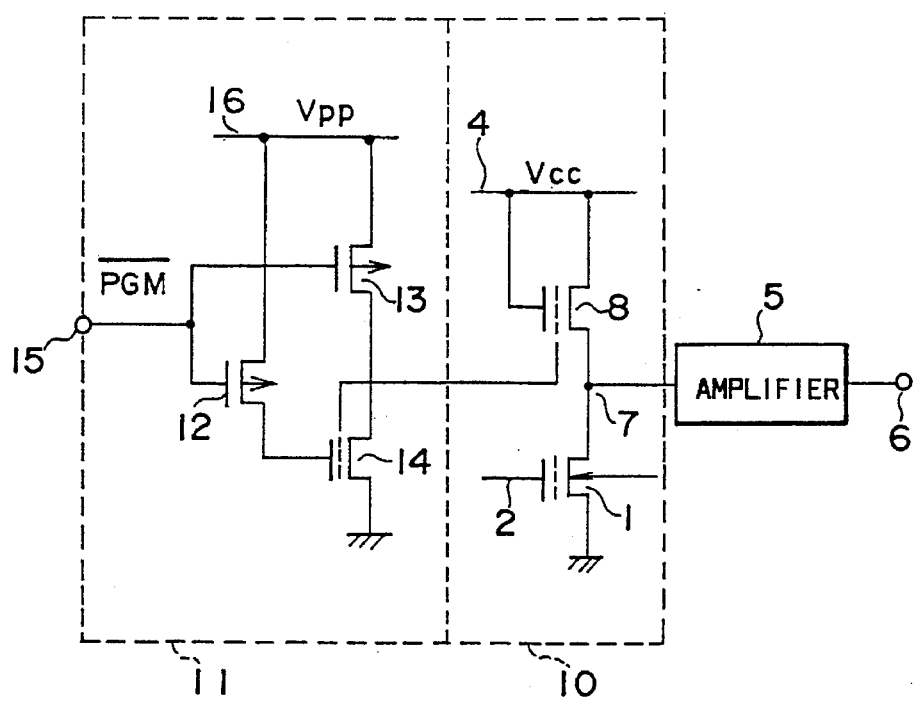
FIG. 3 is a diagram depicting a write circuit of FIG. 2.

FIG. 3 is a diagram showing a write circuit of FIG. 2. Referring to FIG. 3, 10 represents a memory cell portion. In the configuration of this embodiment, the load transistor of the EPROM cell 1 is also an EPROM cell and is given the reference numeral 8 here. The drain and control gate of this EPROM cell 8 are connected to the power line 4; the source thereof is connected to the drain of EPROM cell 1. The connecting point of the source of the EPROM cell 8 and the drain of the EPROM cell 1 is connected to an input terminal of the amplifier 5.

In the same figure, 11 represents a write circuit of the EPROM cell 8. This write circuit 11 is constructed by providing a pMOS 12, a pMOS 13 and an EPROM cell 14. The gate of the pMOS 12 is connected to a programmable signal input terminal 15 into which a programmable signal $\overline{PGM}$ is input, the source of the pMOS 12 is connected to a power line 16 for supplying a write voltage Vpp of, for example, +12 [V] and the drain thereof is connected to a control gate of the EPROM cell 14.

The gate of the pMOS 13 is connected to the programmable signal input terminal 15, the source thereof is connected to the power line 16, the drain thereof is connected to the drain of the EPROM cell 14. Further, the floating gate of the EPROM cell 14 is connected to the floating gate of the EPROM cell 8, the source thereof is grounded.

The write circuit 11 is designed to turn the pMOS 12, and the pMOS 13 ON by bringing the programmable signal $\overline{PGM}$ to an L level at the time of writing, supply the write voltage Vpp to the control gate and the drain of the EPROM cell 14, inject electrons into the floating gate of the EPROM cell 14, and distribute these electrons to the floating gate of the EPROM cell 8.

The writing of the semiconductor memory cell 1 is conducted by the word line 2 via the control gate.

Figure 4:
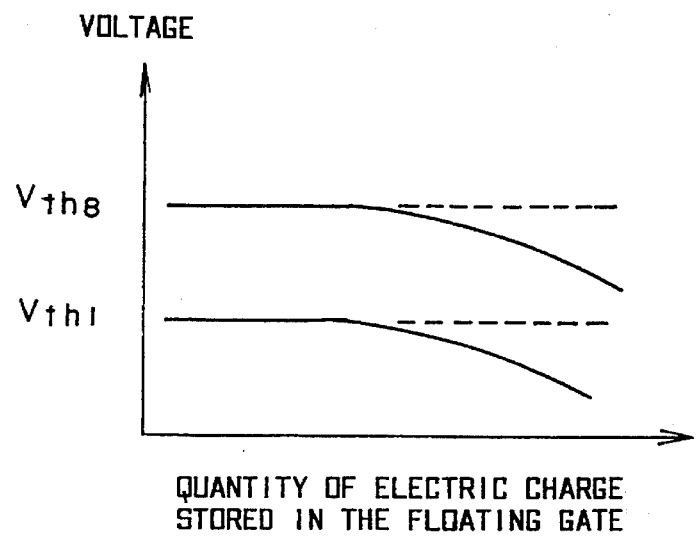
FIG. 4 is a diagram describing an effect of the embodiment of the present invention.

FIG. 4 is a diagram describing an effect of an embodiment of the present invention. In this embodiment, the injection of electrons into the floating gate of the EPROM cell 1 takes place in conjunction with the injection of electrons into the floating gate of the EPROM cell 8. This injection ensures that, as electrons are depleted from the floating gate of the EPROM cell 1 due either to heating during a subsequent assembly process or an acceleration test or to age deterioration, electrons in the floating gate of the EPROM cell 8 are also depleted.

Accordingly, as is evident from the relationship, shown in FIG. 4, between the quantity of electric charge (horizontal axis) stored in the floating gate and the threshold voltage (vertical axis), the voltage difference $Vth_8$–$Vth_1$ between the threshold voltage $Vth_8$ of the EPROM cell 8 and the threshold voltage $Vth_1$ of the EPROM cell 1 is maintained at the same level.

Thus, in accordance with this embodiment, it is possible to read out an initial logic state "0" even after the depletion of electrons from the floating gate of the EPROM cell 1 due either to heating during an assembly process or an acceleration test or to age deterioration.

The quantity of electrons injected into the floating gate of the EPROM cell 8 and the quantity of electrons injected into the floating gate of the EPROM cell 1 can either be the same as or different from each other. It is sufficient that these quantities be large enough to maintain the voltage difference $Vth_8$–$Vth_1$ between the threshold voltage $Vth_8$ of the EPROM cell 8 and the threshold voltage $Vth_1$ of the EPROM cell 1 at the same level.

Figure 5:
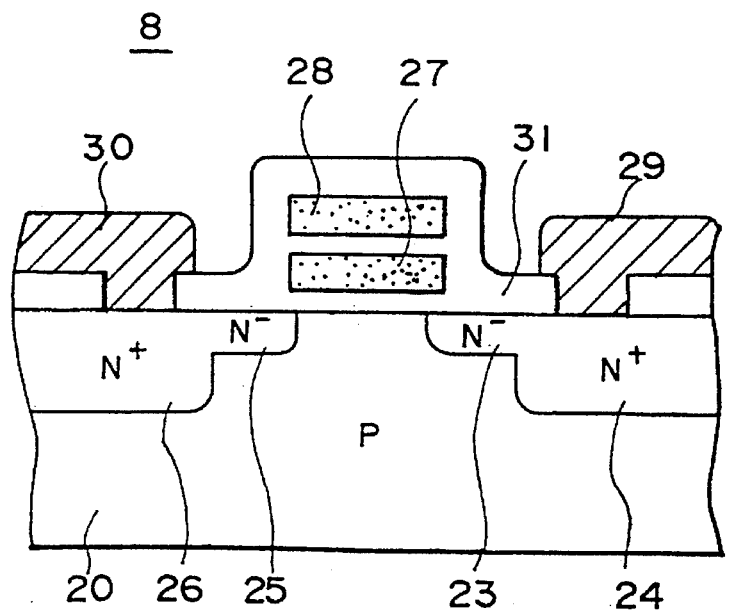
FIG. 5 is a cross-sectional view depicting a suitable structure of a load transistor of the present invention.

FIG. 5 is a cross-sectional view depicting a suitable structure of a load transistor of the present invention. Referring to FIG. 5, 20 represents a P-type silicon substrate; 23 an N⁻ diffused layer serving as a drain region; 24 a N⁺ diffused layer also serving as a drain region; 25 a N⁻ diffused layer serving as a source region; 26 a N⁺ diffused layer also serving as a source region; 27 a floating gate; 28 a control gate; 29, 30 aluminum wirings, and 31 an insulating layer.

The N⁻ diffused layer 23 serving as the drain region is of a so-called LDD (Light Doped Drain) structure. This LDD structure is provided in order to repress the injection of electrons into the floating gate. This repression is required because the injection of electrons into the floating gate during an operation causes such a variation of the threshold voltage $Vth_8$, the variation being expected because 5 [V] is applied to the drain and gate of the EPROM cell 8.

As described in accordance with the above embodiment, since it is possible to maintain the voltage difference between the threshold voltage of the load transistor 8 and the threshold voltage of the semiconductor memory cell 1 at the same level, the initially stored memory content can be read out even after the depletion of electrons from the floating gate of the non-volatile semiconductor memory cell 1, thereby improving a retention characteristic of the memory cell (quality of electric charge retention).

Figure 6:
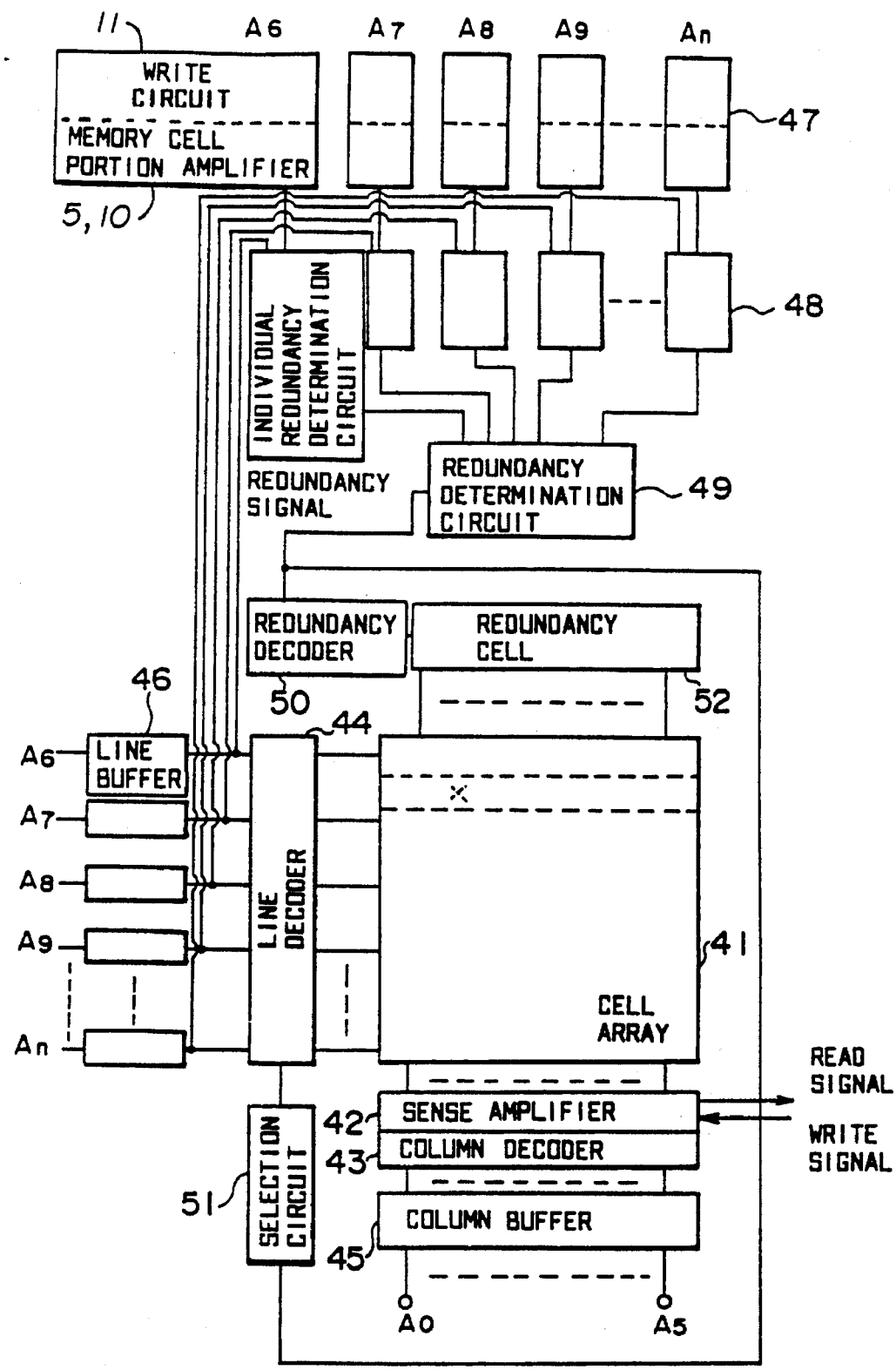
FIG. 6 is a diagram depicting an application of the present invention.

FIG. 6 is a diagram depicting an application of the present invention. FIG. 6 shows a case where the present invention is applied to a redundancy circuit of a memory address circuit in an EPROM.

Referring to FIG. 6, a cell array 41 comprises a sense amplifier circuit 42, a column decoder 43, and a line decoder 44. The sense amplifier circuit 42 receives an input of a write signal and outputs a read signal. Write or read address signals $A_0$–$A_5$ are fed to the column decoder 43 via a column buffer 45. Write or read address signals $A_6$–$A_n$ are fed to the line decoder 44 via respective line buffers 46.

For each of the address signals $A_6$–$A_n$, the write circuit 11, the memory cell portion 10, and the amplifier 5 shown in FIG. 3, and a redundancy determination circuit 47 are provided. The output from each redundancy circuit 47 and the output from each line buffer 46 are fed into a respective individual redundancy determination circuit 48 which corresponds to each redundancy circuit 41 and line buffer 46.

The output from each individual redundancy determination circuit 48 is fed to a redundancy determination circuit 49, where a redundancy signal is output to a redundancy decoder 50 and a selection circuit 51. The selection circuit 51 switches the line decoder 44 between operation and non-operation. The cell array 41 is equipped with a redundancy cell 52, and the redundancy cell 52 is selected by the redundancy decoder 50.

A redundancy address memory circuit is comprised of the redundancy circuits 47, the individual redundancy determination circuits 48, the redundancy determination circuit 49, the redundancy decoder 50, and the redundancy cell 52.

While FIG. 6 shows a case where one set of redundancy address memory circuits is provided for the cell array 41, it is also possible to provide a plurality of sets of redundancy address memory circuits.

Referring to FIG. 6, the cell array 41 is checked for a defective cell by an LSI tester and, in case any defect is found, each of the EPROM cells 1, 8 (see FIG. 3) of the memory cell portion 10 in the relevant redundancy circuit 47 receives a write signal.

When write or read address signals $A_6$–$A_n$ are fed into the respective inputs of the individual redundancy determination circuits 48 via the corresponding line buffers 46, the memory contents of the corresponding redundancy circuits 47 are subject to comparison with each other, the results of this comparison being output to the redundancy determination circuit 49.

The redundancy determination circuit 49 outputs, when the outputs from all of the individual redundancy determination circuits 48 are in agreement, a redundancy signal to activate the redundancy decoder 50 so that the redundancy cell 52 can be selected. At the same time that this selection takes place, the selection circuit 51 switches the line decoder 44 to a non-operation state.

Thus, by applying the present invention, as a redundancy circuit, to a redundancy address memory circuit, the initially stored memory content can be read out even after the depletion of electrons from the EPROM cells 1, 8 due either to heating during an assembly process or acceleration test or to age deterioration, thereby allowing the function of switching to a redundancy cell to be fully accomplished.

While the above embodiment showed a case where the present invention is applied to a redundancy circuit, the present invention is not limited to the above embodiment, and can be applied in any situation where it is required to retain a memory content even after a package is completed.

POSSIBLE APPLICATION IN INDUSTRY

The present invention can be used in a semiconductor memory capable of retaining a memory content even after heating or age deterioration of, for example, a redundancy circuit.

I claim:

1. A semiconductor memory comprising:

a non-volatile semiconductor memory cell having a first charge storage gate and storing a memory content; and a write-enabled load transistor having a second charge storage gate and a control gate maintained at a constant voltage, said load transistor connected to said semiconductor memory cell and reading out the memory content of said semiconductor memory cell.

2. The semiconductor memory as claimed in claim 1, further comprising:

a write semiconductor cell, having a third charge storage gate connected to said second charge storage gate of said load transistor, writing into said load transistor; and a number of write transistors connected to said write semiconductor cell, supplying a write voltage to said write semiconductor cell.

3. The semiconductor memory as claimed in claim 2, wherein said load transistor has a lightly doped drain.

4. The semiconductor memory as claimed in claim 3, further comprising:

a redundancy address memory circuit comprising:

a plurality of said semiconductor memory cells and a corresponding plurality of load transistors.

5. The semiconductor memory as claimed in claim 2, further comprising:

an address memory circuit comprising:

a plurality of said semiconductor memory cells and a corresponding plurality of said load transistors.

6. The semiconductor memory as claimed in claim 2, wherein said write-enabled load transistor comprising:

a P-type silicon substrate;

first and second $N^+$ diffused layers spaced apart from one another, formed on said P-type silicon substrate, and serving as a source and drain region, respectively;

first and second $N^-$ diffused layers spaced apart from one another and formed on said P-type silicon substrate, said first and second $N^-$ diffused layers contacting said first and second $N^+$ diffused layers, respectively, and serving as said source and drain regions, respectively;

an insulating layer formed on said P-type silicon substrate and in contact with said first and second $N^-$ diffused layers;

a control gate formed in said insulating layer; and said second charge storage gate formed in said insulating layer and spaced apart from said control gate.

7. The semiconductor memory as claimed in claim 1, further comprising:

an address memory circuit comprising:

a plurality of said semiconductor memory cells and a corresponding plurality of said load transistors.

8. The semiconductor memory as claimed in claim 1, wherein said write-enabled load transistor comprising:

a P-type silicon substrate;

first and second $N^+$ diffused layers spaced apart from one another, formed on said P-type silicon substrate, and serving as a source and drain region, respectively;

first and second $N^-$ diffused layers spaced apart from one another and formed on said P-type silicon substrate, said first and second $N^-$ diffused layers contacting said first and second $N^+$ diffused layers, respectively, and also serving as said source and drain regions, respectively;

an insulating layer formed on said P-type silicon substrate and in contact with said first and second $N^-$ diffused layers;

a control gate formed in said insulating layer; and said second charge storage gate formed in said insulating layer and spaced apart from said control gate.

9. A semiconductor memory comprising:

a non-volatile semiconductor memory cell having a first charge storage gate and a first channel having first and second ends, said semiconductor cell storing memory information;

a write-enabled load transistor having a second charge storage gate not connected to said first charge storage gate, a second channel having a first end connected to a first potential and a second end connected to said first end of said first channel, and a control gate maintained at a constant voltage, said load transistor reading out the memory information from said semiconductor memory cell; and a write circuit having a third charge storage gate connected to said second charge storage gate, said write circuit injecting electrons into said second charge storage gate.

10. The semiconductor memory as claimed in claim 9, wherein said write circuit comprises:

a write semiconductor cell having said third charge storage gate, distributing said electrons to said second charge storage gate; and a number of write transistors supplying a second potential to said write semiconductor cell.

11. The semiconductor memory as claimed in claim 9, wherein said write-enabled load transistor comprising:

a P-type silicon substrate;

first and second $N^+$ diffused layers spaced apart from one another, formed on said P-type silicon substrate, and serving as a source and drain region, respectively;

first and second $N^-$ diffused layers spaced apart from one another and formed on said P-type silicon substrate, said first and second $N^-$ diffused layers contacting said first and second $N^+$ diffused layers, respectively, and serving as said source and drain regions, respectively;

an insulating layer formed on said P-type silicon substrate and in contact with said first and second $N^-$ diffused layers;

a control gate formed in said insulating layer; and said second charge storage gate formed in said insulating layer and spaced apart from said control gate.

12. A semiconductor memory comprising:

a non-volatile semiconductor memory cell having a first threshold voltage, a first charge storage gate and a first channel having first and second ends, said semiconductor cell storing memory information;

a write-enabled load transistor having a second threshold voltage, a second charge storage gate not connected to said first charge storage gate and a second channel having a first end connected to a first potential and a second end connected to said first end of said first channel, said load transistor reading out the memory information from said semiconductor memory cell; and means for maintaining a constant difference between said first threshold voltage and said second threshold voltage.

13. The semiconductor memory as claimed in claim 12, wherein said means for maintaining a constant voltage comprises:

a write semiconductor cell having a third charge storage gate connected to said second charge storage gate, said write semiconductor cell distributing electrons to said second charge storage gate; and a number of write transistors supplying a second potential to said write semiconductor cell.

14. The semiconductor memory as claimed in claim 13, wherein said write semiconductor cell comprises an EPROM cell.

15. A semiconductor memory comprising:

a non-volatile semiconductor memory cell having a first charge storage gate and a first channel having first and second ends, said semiconductor cell storing memory information;

a write-enabled load transistor having a second charge storage gate not connected to said first charge storage gate and a second channel having a first end connected to a first potential and a second end connected to said first end of said first channel, said load transistor reading out the memory information from said semiconductor memory cell; and a write circuit having a third charge storage gate connected to said second charge storage gate and not connected to said first charge storage gate, said write circuit injecting electrons into said second charge storage gate.

* * * * *

UNITED STATES PATENT AND TRADEMARK OFFICE
CERTIFICATE OF CORRECTION

PATENT NO. : 5,469,381
DATED : Nov. 21, 1995
INVENTOR(S) : YAMAZAKI

It is certified that error appears in the above-indentified patent and that said Letters Patent is hereby corrected as shown below:

Col. 1, line 29, after "i.e." insert --,--;
line 50, after "i.e." insert --,--;
line 54, after "i.e." insert --,--.

Col. 4, line 59, change "circuit 41" to --circuit 47--.

Signed and Sealed this

Eleventh Day of June, 1996

Attest:

BRUCE LEHMAN

*Attesting Officer*  *Commissioner of Patents and Trademarks*